United States Patent
Chen et al.

(10) Patent No.: US 11,606,063 B2
(45) Date of Patent: *Mar. 14, 2023

(54) CRYSTAL OSCILLATOR AND PHASE NOISE REDUCTION METHOD THEREOF

(71) Applicant: MEDIATEK INC., Hsin-Chu (TW)

(72) Inventors: Chien-Wei Chen, Hsinchu (TW);
Yu-Li Hsueh, Hsinchu (TW);
Keng-Meng Chang, Hsinchu (TW);
Yao-Chi Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/695,863

(22) Filed: Mar. 16, 2022

(65) Prior Publication Data

US 2022/0209715 A1 Jun. 30, 2022

Related U.S. Application Data

(63) Continuation of application No. 17/306,959, filed on May 4, 2021, now Pat. No. 11,342,884.

(Continued)

(51) Int. Cl.
*H03B 5/36* (2006.01)
*H03K 19/21* (2006.01)

(52) U.S. Cl.
CPC .............. *H03B 5/36* (2013.01); *H03B 5/362* (2013.01); *H03K 19/21* (2013.01); *H03B 2200/009* (2013.01)

(58) Field of Classification Search
CPC ........ H03B 5/30–368; H03B 2200/009; H03K 19/21

(Continued)

(56) References Cited

U.S. PATENT DOCUMENTS 4,319,204 A   3/1982   Weldon
4,704,587 A   11/1987  Ouyang
(Continued)

FOREIGN PATENT DOCUMENTS

CN   102332915 A   1/2012
CN   103891147 A   6/2014
(Continued)

OTHER PUBLICATIONS

Jerry Lin, "A Low-Phase-Noise 0.004-ppm/Step DCXO With Guaranteed Monotonicity in the 90-nm CMOS Process", JSSC, Dec. 2005, IEEE, USA.

(Continued)

*Primary Examiner* — Levi Gannon
(74) *Attorney, Agent, or Firm* — Winston Hsu

(57) ABSTRACT

A crystal oscillator and a phase noise reduction method thereof are provided. The crystal oscillator includes a crystal oscillator core circuit, a bias circuit coupled to an output terminal of the crystal oscillator core circuit, a pulse wave buffer coupled to the output terminal of the crystal oscillator core circuit, and a phase noise reduction circuit coupled to the output terminal of the crystal oscillator core circuit. The crystal oscillator core circuit may generate a sinusoidal wave. The bias circuit may provide a bias voltage of the sinusoidal wave. The pulse wave buffer may generate a pulse wave according to the sinusoidal wave. The phase noise reduction circuit may provide an alternating current (AC) ground path for noise on the bias voltage according to a reset pulse, wherein a position of the reset pulse is set by a control voltage on a control terminal of the phase noise reduction circuit.

12 Claims, 8 Drawing Sheets

Related U.S. Application Data

(60) Provisional application No. 63/070,347, filed on Aug. 26, 2020.

(58) Field of Classification Search
USPC .................. 331/116 FE, 116 R, 154, 158
See application file for complete search history.

(56) References Cited

U.S. PATENT DOCUMENTS

| | | |
|---|---|---|
| 5,223,801 A | 6/1993 | Bergman |
| 6,211,746 B1 | 4/2001 | Segawa |
| 6,683,506 B2 | 1/2004 | Ye |
| 7,126,432 B2 | 10/2006 | Roubadia |
| 7,292,114 B2 | 11/2007 | Greenberg |
| 8,502,565 B2 | 8/2013 | Arnborg |
| 9,407,201 B1 | 8/2016 | Iguchi |
| 9,906,209 B2 | 2/2018 | Chang |
| 10,840,897 B1 | 11/2020 | Rafi |
| 11,342,884 B2 | 5/2022 | Chen |
| 2007/0013455 A1 | 1/2007 | Roubadia |
| 2010/0244967 A1 | 9/2010 | Watanabe |
| 2011/0241787 A1 | 10/2011 | Mastovich |
| 2012/0126907 A1 | 5/2012 | Nakamoto |
| 2014/0104009 A1 | 4/2014 | Lin |
| 2016/0072497 A1 | 3/2016 | Paramanandam |
| 2017/0170784 A1 | 6/2017 | Huang |
| 2018/0109264 A1 | 4/2018 | Kim |
| 2018/0159470 A1 | 6/2018 | Chen |
| 2019/0044479 A1 | 2/2019 | Vijayaraghavan |
| 2019/0109563 A1 | 4/2019 | Lin |
| 2019/0312573 A1 | 10/2019 | Aouini |
| 2020/0177128 A1 | 6/2020 | Ciubotaru |
| 2020/0204115 A1 | 6/2020 | Ahmed |
| 2020/0235702 A1 | 7/2020 | Kumar |

FOREIGN PATENT DOCUMENTS

| | | |
|---|---|---|
| CN | 106656173 A | 5/2017 |
| CN | 109155610 A | 1/2019 |

OTHER PUBLICATIONS

Liu, the specification, including the claims, and drawings in the U.S. Appl. No. 17/306,960, filed May 4, 2021.

J. Borremans et al., "A Low-Complexity, Low Phase Noise, Low-Voltage Phase-Aligned Ring Oscillator in 90 nm Digital Cmos", ESSCIRC 2008—34th European Solid-State Circuits Conference, 2008 IEEE, UK, pp. 410-413, 2008.

Liu, the specification, including the claims, and drawings in the U.S. Appl. No. 17/693,454, filed Mar. 14, 2014.

CRYSTAL OSCILLATOR AND PHASE NOISE REDUCTION METHOD THEREOF

CROSS REFERENCE TO RELATED APPLICATION

This application is a continuation application of U.S. application Ser. No. 17/306,959, filed on May 4, 2021, which claims the benefit of U.S. Provisional Application No. 63/070,347, filed on Aug. 26, 2020. The contents of these applications are incorporated herein by reference.

BACKGROUND

The present invention is related to crystal oscillators, and more particularly, to a crystal oscillator and a phase noise reduction method thereof.

For an electronic system such as a phase-locked loop, a reference clock is required. More particularly, phase noise of the reference clock severely impact overall performance of the electronic system, and phase noise related performance is therefore demanding. In general, the reference clock can be generated by a crystal oscillator such as a Pierce oscillator or a Colpitts oscillator. Proposed methods and related architecture in a related art greatly increase additional circuits to improve overall performance of the crystal oscillator (e.g. reduce phase noise thereof). Thus, there is a need for a novel architecture and related method, to reduce phase noise of the crystal oscillator (more particularly, to reduce the phase noise of the reference clock) without introducing any side effect or in a way that is less likely to introduce side effects.

SUMMARY

This in mind, an objective of the present invention is to provide a crystal oscillator and a phase noise reduction method thereof, to improve phase noise related performance of an electronic system, and more particularly, to reduce phase noise of a reference clock output from a crystal oscillator of the electronic system.

At least one embodiment of the present invention provides a crystal oscillator. The crystal oscillator may comprise a crystal oscillator core circuit, a bias circuit, a pulse wave buffer and a phase noise reduction circuit. The crystal oscillator core circuit is configured to generate a sinusoidal wave. The bias circuit is coupled to an output terminal of the crystal oscillator core circuit, and is configured to provide a bias voltage of the sinusoidal wave. The pulse wave buffer is coupled to the output terminal of the crystal oscillator core circuit, and is configured to generate a pulse wave according to the sinusoidal wave. The phase noise reduction circuit is coupled to the output terminal of the crystal oscillator core circuit, and is configured to generate a reset signal comprising at least one reset pulse for resetting the bias voltage (e.g. resetting resistor noise on the bias voltage) by providing an alternating current (AC) ground path for noise on the bias voltage. More particularly, the phase noise reduction circuit is configured to generate a modified pulse wave according to the sinusoidal wave, and generate a reset signal comprising at least one reset pulse according to the modified pulse wave. In addition, a position of the at least one reset pulse on the reset signal is set by a control voltage on a control terminal of the phase noise reduction circuit.

More particularly, the reset signal is generated without calibrating the at least one reset pulse to a zero-crossing point of the sinusoidal wave.

At least one embodiment of the present invention provides a phase noise reduction method of a crystal oscillator. The phase noise reduction method may comprise: generating a sinusoidal wave by a crystal oscillator core circuit of the crystal oscillator; providing a bias voltage of the sinusoidal wave by a bias circuit; generating a pulse wave according to the sinusoidal wave by a pulse wave buffer; and providing an AC ground path for noise on the bias voltage for resetting the bias voltage (e.g. resetting resistor noise on the bias voltage). The AC ground path is provided in response to a reset signal, which is generated without calibrating a position of the at least one reset pulse to a zero-crossing point of the sinusoidal wave. More particularly, providing the AC ground path may comprises: generating a modified pulse wave according to the sinusoidal wave; and generating a reset signal according to the modified pulse wave. In addition, a position of at least one reset pulse on the reset signal is set by a control voltage on a control terminal of the phase noise reduction circuit.

The crystal oscillator and the phase noise reduction method of the present invention can reduce phase noise without calibrating the timing of performing the phase noise reset operation, and overall costs of implementing the phase noise reduction can be greatly reduced in comparison with the related art. Thus, the present invention can reduce phase noise of the crystal oscillator (more particularly, to reduce phase noise of a reference clock such as the pulse wave output from the crystal oscillator) without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
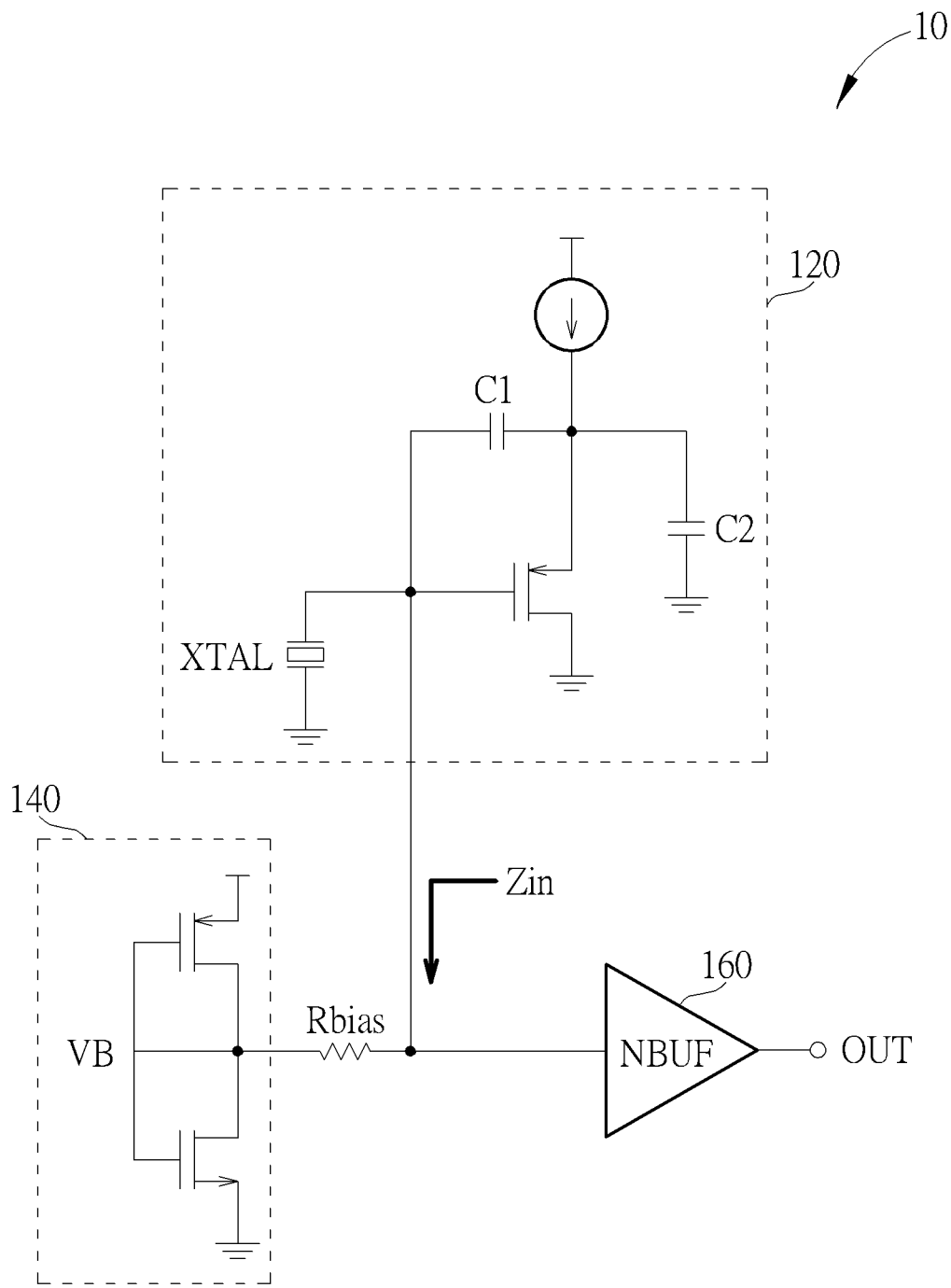
FIG. 1 is a diagram illustrating a crystal oscillator according to an embodiment of the present invention.

FIG. 1 is a diagram illustrating a crystal oscillator 10 according to an embodiment of the present invention. The crystal oscillator 10 may comprise a crystal oscillator core circuit 120, a bias circuit such as a direct current (DC) bias circuit 140, a bias resistor Rbias and a pulse wave buffer such as a square wave buffer 160 (which is labeled "NBUF" for brevity). The crystal oscillator core circuit 120 may be a Colpitts oscillator as shown in FIG. 1, which comprises a crystal tank XTAL (which may be referred to as "crystal oscillator (XO)"), capacitors C1 and C2, a transistor and a current source, but the present invention is not limited thereto. For example, the crystal oscillator core circuit 120 may be replaced with a Pierce oscillator in some embodiments. In this embodiment, the DC bias circuit 140 is coupled to an output terminal of the crystal oscillator 120 through the bias resistor Rbias, and the square wave buffer 160 is coupled to the output terminal of the crystal oscillator 120. For example, the output terminal of the crystal oscillator and an input terminal of the square wave buffer 160 are coupled to a node of the crystal oscillator 10, and the DC bias circuit 140 is coupled to this node through the bias resistor Rbias, where an input impedance of this node may be indicated by Zin, and Zin is roughly determined by the bias resistor Rbias.

In this embodiment, the crystal oscillator core circuit 120 is designed to have a high quality factor (e.g. greater than or equal to 100000), and is configured to generate a sinusoidal wave. The DC bias circuit 140 may comprise one or more transistors as shown in FIG. 1, and is configured to provide a bias voltage of the sinusoidal wave, such as a DC bias voltage VB. For example, the sinusoidal wave is carried on the level of the DC bias voltage VB (more particularly, the sinusoidal wave may regularly vary up and down based on the level of the DC bias voltage VB). In addition, the pulse wave buffer such as the square wave buffer 160 may generate a pulse wave such as a square wave on an output terminal OUT of the square wave buffer 160 according to the sinusoidal wave. For example, the square wave buffer 160 may comprise an inverter or a chain of inverters, wherein when the level of the sinusoidal wave is greater than a threshold (e.g. an input voltage level threshold) of the square wave buffer 160, the square wave may have a first state (e.g. a first logic value such as "1"), and when the level of the sinusoidal wave is less than the threshold of the square wave buffer 160, the square wave may have a second state (e.g. a second logic value such as "0"). In some embodiment, the pulse wave generated by the pulse wave buffer may be a rectangular wave having a duty cycle equal to 50%, such as the square wave. In some embodiments, the pulse wave generated by the pulse wave buffer may be a rectangular wave having a duty cycle that is not 50%. The following descriptions takes the square wave as an example for illustrative purposes only, and is not meant to be a limitation of the present invention.

In one embodiment, the bias resistor Rbias may contribute a majority of phase noise of the square wave. In particular, the bias resistor Rbias may contribute noise which has a positive correlation with the resistance of the bias resistor Rbias. For example, the higher the resistance of the bias resistor Rbias, the higher the noise is generated. In contrast, signal power of the sinusoidal wave has a negative correlation with the resistance of the bias resistor Rbias. For example, the higher the resistance of the bias resistor Rbias, the higher the signal power of the sinusoidal wave (i.e. the lower the resistance of the bias resistor Rbias, the more the loss of the sinusoidal wave is caused). Thus, there is a trade-off between loss and noise, and the present invention aims at breaking this trade-off.

In detail, as the quality factor of the crystal oscillator core circuit 120 is high enough, the thermal noise from the bias resistor Rbias will not greatly impact a signal-to-noise ratio (SNR) of the sinusoidal wave on the output terminal of the crystal oscillator core circuit 120. For example, the crystal oscillator core circuit 120 can filter out most of the noise caused by the bias resistor Rbias at a certain frequency offset such as 100 kilo Hertz (kHz) relative to the oscillation frequency of the sinusoidal wave. Based on the description above, even though the bias resistor Rbias contributes noise, the phase noise of the sinusoidal wave can be small, such as −185 decibels relative to the carrier in one Hertz bandwidth (dBc/Hz). The phase noise on the output terminal OUT of the square wave buffer may be high (e.g. −165 dBc/Hz), however.

Figure 2:
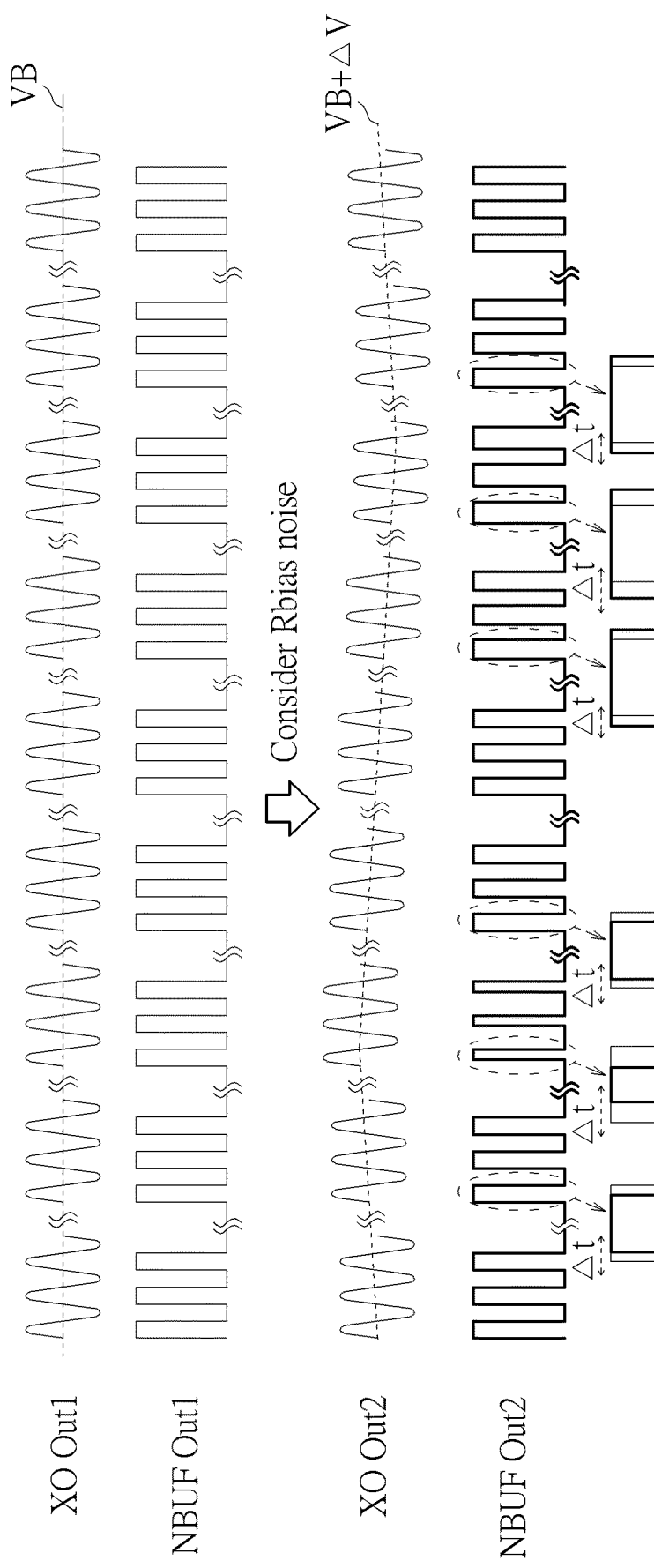
FIG. 2 is a diagram illustrating how noise of a bias resistor is introduced into a square wave output from a square wave buffer.

In order to better understand how the noise of the bias resistor Rbias is introduced into the square wave on the output terminal OUT of the square wave buffer 160, please refer to FIG. 2. If the bias resistor Rbias does not contributes noise, the sinusoidal wave may be carried on a constant level of VB as illustrated by the waveform labeled "XO Out1" (e.g. a 40 Mega Hertz (MHz) sinusoidal wave may regularly vary up and down based on the constant level of VB), and the pulse width of the square wave may be constant, as illustrated by the waveform labeled "NBUF Out1". By comparison, if the bias resistor Rbias contributes noise (e.g. which may be modeled as a 100 kHz bias noise source), the sinusoidal wave may be carried on a varying level VB+ΔV as illustrated by the waveform labeled "XO Out2" (e.g. a 40 MHz sinusoidal wave may vary up and down based on a time-varying level of a 100 kHz bias noise). Thanks to the characteristics brought from the high quality factor of the crystal oscillator core circuit 120, phase noise of the sinusoidal wave is not significantly increased when the noise of the bias resistor Rbias is considered. For the square wave, the timing of state transition (e.g. rising edges and falling edges) may be significantly impacted by voltage level variation on the input terminal of the square wave buffer, and the pulse width of the square wave may be time-varying as illustrated by the portions being circled (e.g. time-varying phase shift Δt) on the waveform labeled "NBUF Out2", which results the phase noise of the square wave on the output terminal OUT of the square wave buffer 160. As shown in the bottommost of FIG. 2, the waveform depicted by thin lines represent the output of the square wave buffer 160 without considering the noise of the bias resistor (which has a constant pulse width), and the waveform depicted by bold lines represent the output of the square wave buffer 160 with considering the noise of the bias resistor (which has a time-varying pulse width), where difference between these two waveform may be illustrated by the time-varying phase shift Δt, which may be regarded as the phase noise mentioned above.

Figure 3:
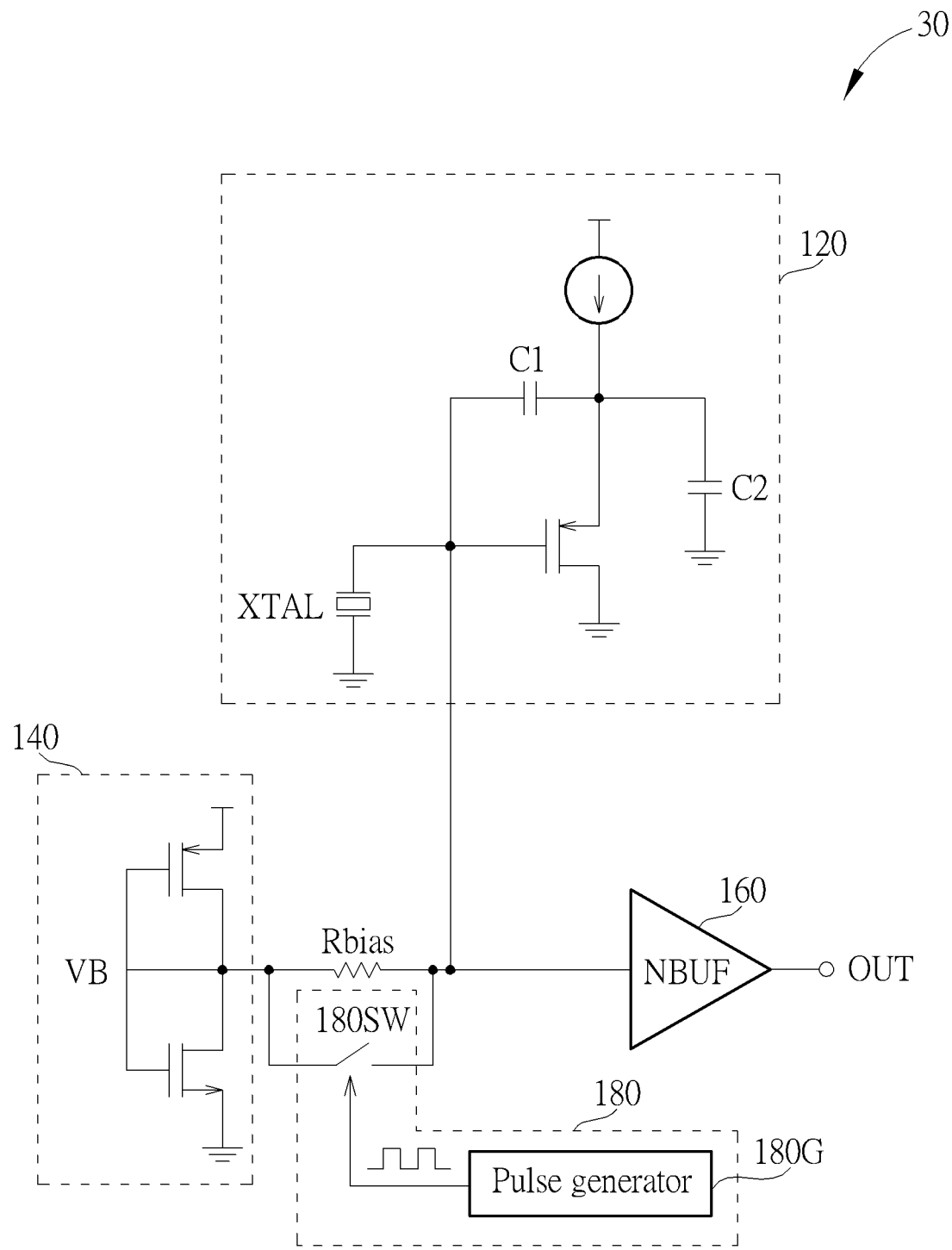
FIG. 3 is a diagram illustrating a crystal oscillator according to an embodiment of the present invention.

FIG. 3 is a diagram illustrating a crystal oscillator 30 according to an embodiment of the present invention. In addition to the crystal oscillator core circuit 120, the DC bias circuit 140, the bias resistor Rbias and the square wave buffer 160, the crystal oscillator 30 may further comprise a phase noise reduction circuit 180. The phase noise reduction circuit 180 is coupled to the output terminal of the crystal oscillator core circuit 120, and may be configured to generate a reset signal comprising at least one reset pulse (e.g. one or more pulses, which may be collectively referred to as the reset pulse) for resetting the bias voltage (e.g. resetting resistor noise on the bias voltage, such as the noise contributed by the bias resistor Rbias) of the sinusoidal wave (e.g. by providing an alternating current (AC) ground path for the resistor noise on the bias voltage). More particularly, the reset signal is generated without calibrating the at least one reset pulse to a zero-crossing point of the sinusoidal wave, where the zero-crossing point of the sinusoidal wave may represents the time point at which the sinusoidal wave varies across the level of the DC bias voltage VB. By simulation, it can be noted that the position of the reset pulse (e.g. the timing of the reset pulse relative to the phase of the sinusoidal wave) will not greatly impact the improvement of the phase noise reduction (i.e. the position of the reset pulse is not critical, and different positions of the reset pulse can obtain similar improvement), so the reset pulse can be at the zero-crossing point or peaking of the sinusoidal wave output, and complicated calibration circuits regarding the timing of the reset pulse are not required.

As shown in FIG. 3, the phase noise reduction circuit 180 may comprise a reset switch 180SW coupled to the output terminal of the crystal oscillator core circuit 120, and may be controlled by the reset signal. In addition, the phase noise reduction circuit 180 may further comprise a pulse generator 180G configured to generate the reset signal. In this embodiment, the reset switch may be turned on in response to the reset pulse, to provide an AC ground path for the resistor noise on the bias voltage to remove the noise on the bias voltage, and thereby reset the bias voltage of the sinusoidal wave to a reset level. For example, the reset switch 180SW may be coupled across the bias resistor Rbias, and when the reset switch is turned on, the noise generated by the bias resistor Rbias may be reset, and the varying bias voltage level of the sinusoidal wave can be pulled back to the original voltage level of the DC bias voltage VB, but the present invention is not limited thereto.

Figure 4:
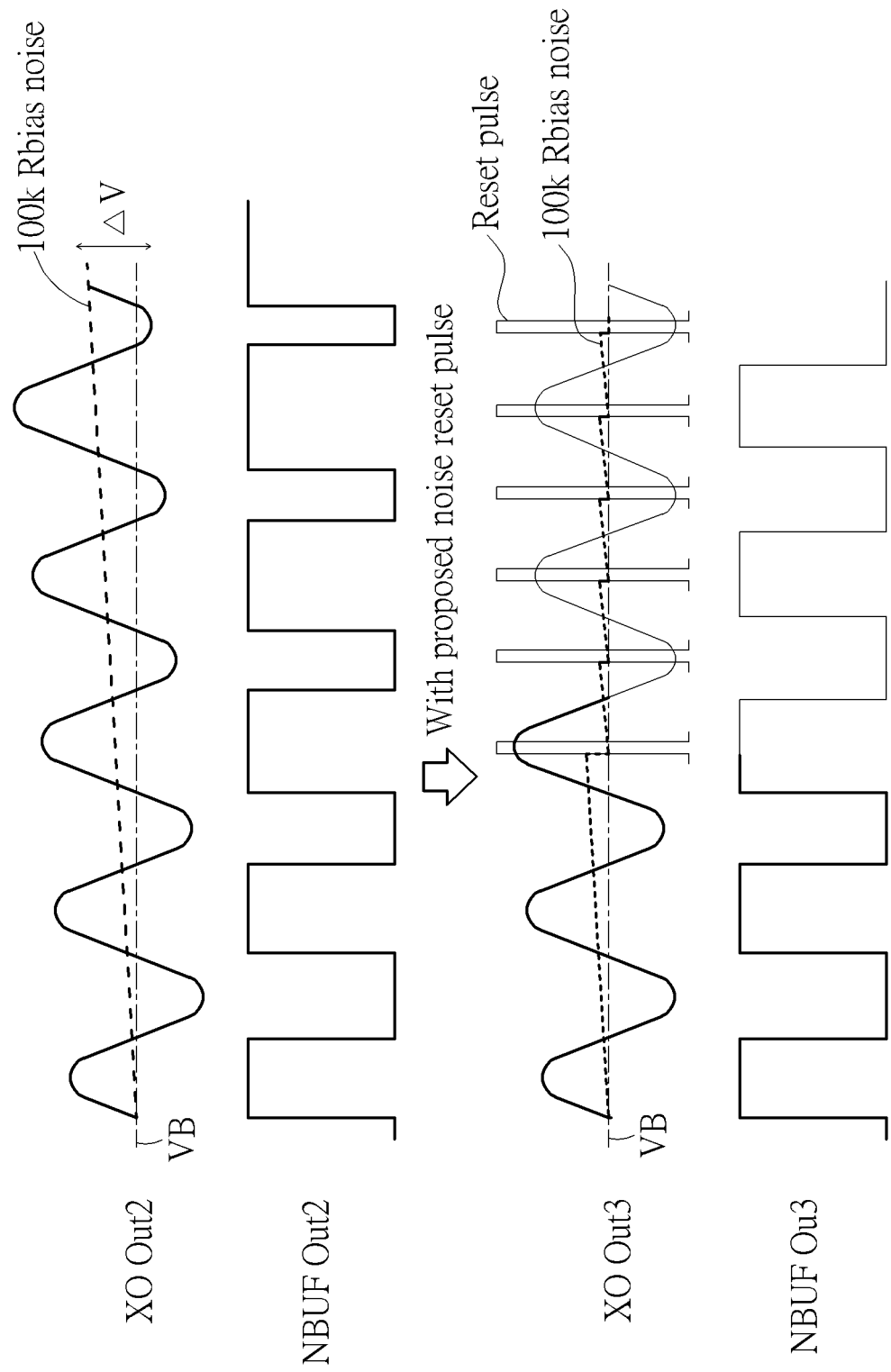
FIG. 4 is a diagram illustrating phase noise reduction with aid of noise reset pulses according to an embodiment of the present invention.

In order to better understand how the phase noise reduction circuit 180 solves the problem of the phase noise caused by the bias resistor Rbias, please refer to FIG. 4. As shown in the upper-half portion of FIG. 4, the waveforms labeled "XO Out2" and "NBUF Out2" represent the sinusoidal wave on the output terminal of the crystal oscillator core circuit 120 and the square wave on the output terminal of the square wave buffer 160 without using the proposed noise reset pulse (e.g. the phase noise reduction circuit 180 is disabled and the reset switch 180SW is always turned off); and as shown in the lower half-portion of FIG. 4, the waveforms labeled "XO Out3" and "NBUF Out3" represent the sinusoidal wave on the output terminal of the crystal oscillator core circuit 120 and the square wave on the output terminal of the square wave buffer 160 with using the proposed noise reset pulse (e.g. the phase noise reduction circuit 180 is enabled and the pulse generator 180G starts to output the reset pulse to periodically turn on the reset switch 180SW). As shown in FIG. 4, the sinusoidal wave may vary up and down based on a time varying level VB+ΔV when the phase noise reduction circuit 180 is disabled, and the pulse width of the square wave is therefore time-varying, which results phase noise. By comparison, when the phase noise reduction circuit 180 is enabled and the pulse generator starts to output the reset pulse to the reset switch 180SW (e.g. periodically output the reset pulse to the reset switch 180SW), the DC bias voltage level of the sinusoidal wave is therefore reset in response to the reset pulse, and the pulse width of the square wave can be substantially constant, or the varying amount of the bias level of the sinusoidal wave can be reduced (e.g. ΔV can be reduced). Thus, the pulse width of the square wave can be constant or substantially constant, and the phase noise is therefore reduced.

It should be noted that both of the resistance of the bias resistor Rbias and an input capacitance on the output terminal of the crystal oscillator core circuit 120 can be designed to be quite large, and a large resistance-capacitance (RC) time constant will make the noise of the bias resistor Rbias have insufficient time for greatly change the level of the sinusoidal wave. For example, after the bias voltage level of the sinusoidal wave is reset and the reset switch 180SW is turned off again, the noise of the bias resistor Rbias will not make the bias voltage level of the sinusoidal wave be greatly changed immediately as the time constant is large enough, and when the noise accumulates and makes the bias voltage level of the sinusoidal wave be slightly changed, the next reset pulse can reset the bias voltage level again, as shown in FIG. 4. In view of this, the frequency of the reset signal is preferably to be fast enough to better suppress the noise of the bias resistor Rbias, and thereby maintain the bias voltage level of the sinusoidal wave. By simulation, assuming the frequency of the sinusoidal wave is 40 MHz, when the frequency of the reset signal is 40 MHz, significant improvements on noise related performance can be observed; and when the frequency of the reset signal is 400 MHz, the noise related performance can be further improved. Thus, a higher frequency of the reset signal is preferred for obtaining a better noise related performance, but the present invention is not limited thereto. In some embodiments, the phase noise reduction circuit 180 may further comprise a frequency multiplier configured to generate a signal having a frequency that is N times the frequency of the square wave output from the square wave buffer 160, and accordingly make the frequency of the reset signal is N times the frequency of the square wave (e.g. there may be N reset pulses within one cycle of the sinusoidal wave or the square wave), where N may be a positive integer greater than or equal to two. In some embodiment, the frequency of the reset signal may be lower than or equal to the frequency of the sinusoidal wave. In some embodiment, the reset pulse may be periodically generated, and the frequency of the reset pulse may be any suitable positive value. In some embodiments, the reset pulse is not periodically generated, e.g. the pulse generator 180G may randomly generate the reset pulse or the occurrence of the reset pulse may be controlled by another controller within the crystal oscillator 30.

In addition to the noise generated by the bias resistor Rbias (which is referred to as the Rbias noise for brevity), there are some factors that may affect the SNR of the sinusoidal wave, such as a turned-on period $T_{ON}$ of the reset pulse (e.g. a pulse width of the reset pulse, which indicates a time length of the reset switch 180SW being turned on), a turned-on resistance $R_{ON}$ of the reset switch 180SW (e.g. a resistance of the reset switch 180SW in a situation where the reset switch 180SW is turned on), and noise corresponding to the turned-on resistance $R_{ON}$ (which is referred to as the $R_{ON}$ noise for brevity). By calculation, the SNR may be expressed as follows:

$$SNR \propto \frac{R_{avg}^2}{N_{Rbias}(f) + N_{Ron}(f)} = \frac{\left[\frac{1}{R_{ON}} * \alpha + \frac{1}{R_{BIAS}} * (1-\alpha)\right]^{-2}}{N_{Rbias}(f) + N_{Ron}(f)}.$$

The symbol f represents a variable of the frequency. The symbol $R_{avg}$ represents an average resistance on the output terminal of the crystal oscillator, which may be further expressed by the turned-on resistance $R_{ON}$, the resistance $R_{BIAS}$ of the bias resistor Rbias, and a parameter $\alpha$, where $\alpha = T_{ON}/T_{xo}$, and the symbol $T_{xo}$ represents a cycle period of the sinusoidal wave output from the crystal oscillator core circuit 120. The symbols $N_{Rbias}(f)$ and $N_{Ron}(f)$ respectively represent the Rbias noise and the $R_{ON}$ noise corresponding to the frequency f. Assuming that the Rbias noise $N_{Rbias}(f)$ can be reset (e.g. considering different combinations of $R_{ON}$ and $T_{ON}$ under a condition where the Rbias noise $N_{Rbias}(f)$ is able to be reset to the same order), the equation shown above may be further arranged as follows:

$$SNR \propto \frac{\left[\frac{R_{ON}R_{BIAS}}{\alpha R_{BIAS} + (1-\alpha)R_{ON}}\right]^2}{N_{Ron}(f)} =$$

$$\frac{\left[\frac{R_{ON}R_{BIAS}}{\alpha R_{BIAS} + (1-\alpha)R_{ON}}\right]^2}{\underbrace{\frac{4\alpha kTR_{ON}}{1+(2\pi R_{ON}C_{IN}*f)^2}}_{\text{Sample noise}} + \underbrace{(1-\alpha)^2 \frac{kT}{f_{XO}C_{IN}}\text{sinc}^2\left[(1-\alpha)\frac{\pi f}{f_{XO}}\right]}_{\text{Hold noise}}}.$$

The symbol k represents the Boltzmann constant. The symbol T represents the absolute temperature. The symbol $C_{IN}$ represents the input capacitance on the output terminal of the crystal oscillator core circuit 120. The symbol $f_{xo}$ represents the frequency of the sinusoidal wave. As illustrated in the equation shown above, the $R_{ON}$ noise $N_{Ron}(f)$ may comprise the sample noise and the hold noise. Assuming that the frequency f is much smaller than the frequency $f_{xo}$ of the sinusoidal wave (e.g. when $f/f_{xo}$ is quite close to zero), the equation shown above may be further simplified as follows:

$$SNR \propto \frac{\left[\frac{R_{ON}R_{BIAS}}{\alpha R_{BIAS} + (1-\alpha)R_{ON}}\right]^2}{4\alpha kTR_{ON} + (1-\alpha)^2 \frac{kT}{f_{XO}C_{IN}}} =$$

$$\frac{\left[\frac{R_{BIAS}}{R_{BIAS}\frac{\alpha}{R_{ON}} + (1-\alpha)}\right]^2}{4\alpha kTR_{ON} + (1-\alpha)^2\frac{kT}{f_{XO}C_{IN}}} \begin{cases} \alpha \to 1: \frac{R_{ON}}{4kT} \\ \alpha \to 0: \frac{f_{XO}C_{IN}R_{BIAS}^2}{kT} \end{cases}.$$

Based on the equation shown above, it can be noted that under a condition where the Rbias noise is reset to the same order, it is preferably to design a smaller a for better SNR. For example, under the condition where the Rbias noise is reset to the same order, when the pulse width of the reset pulse is reduced, the SNR of the sinusoidal wave may be increased. Therefore, utilizing a very short reset pulse (e.g. a reset pulse having an extremely narrow pulse width) to reset the Rbias noise is the optimized design for noise related performance of the crystal oscillator 30. In practice, the small a may be implemented by an exclusive-OR (XOR) logic circuit and a very short delay line, and thereby benefit from small area, low current consumption, and low noise from the delay line. The aforementioned very short delay line may comprise one inverter or a chain of inverters, but the present invention is not limited thereto. It should be noted that the delay provided by the aforementioned very short delay line is not limited to a specific value, any delay that is able to reset the bias voltage level of the sinusoidal wave without significantly degrading the SNR, such as 100 picoseconds (ps), 80 ps, etc.

Figure 5:
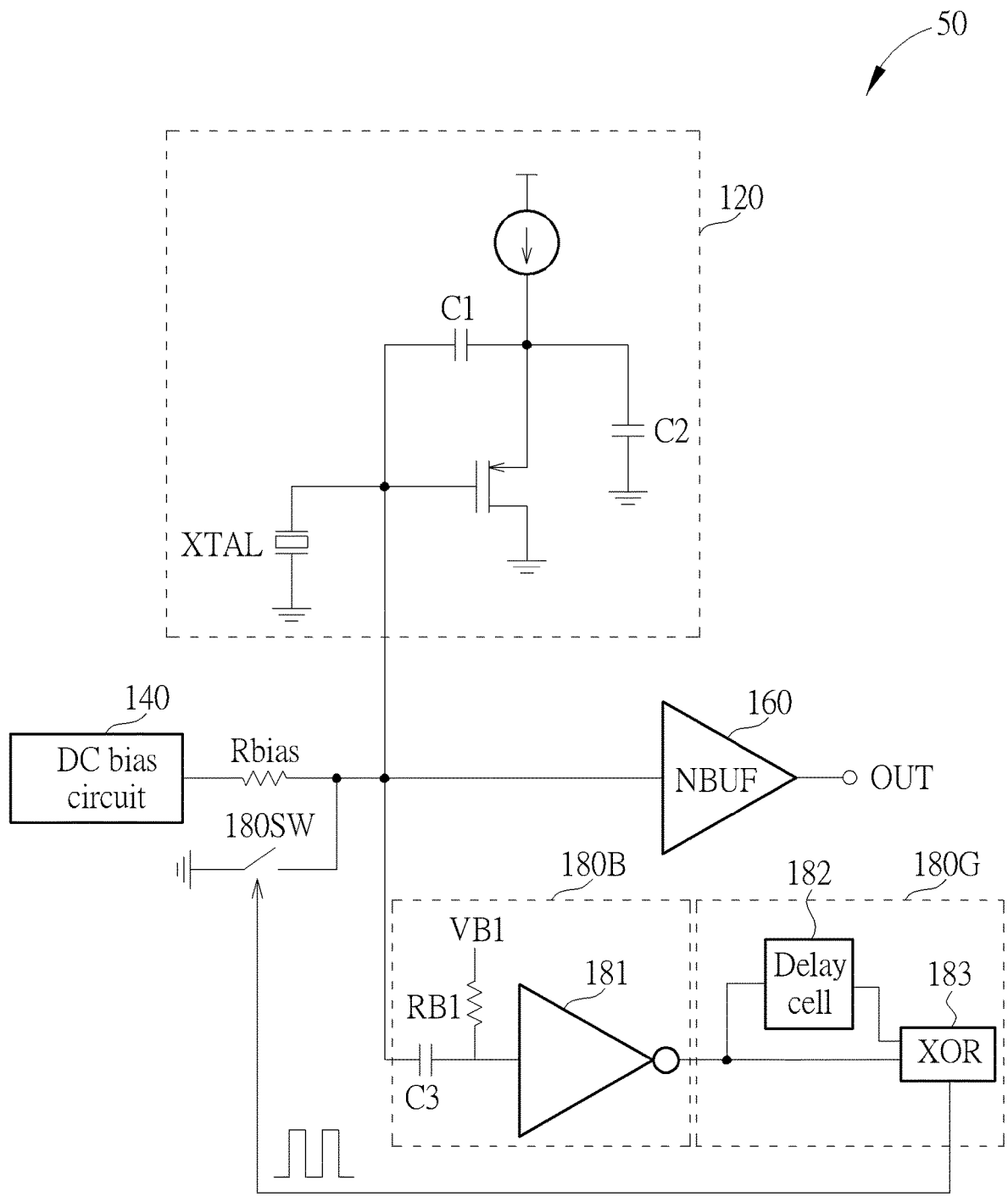
FIG. 5 is a diagram illustrating a crystal oscillator according to an embodiment of the present invention.

FIG. 5 is a diagram illustrating a crystal oscillator 50 according to an embodiment of the present invention, where the crystal oscillator 50 may be a modified version or an example of the crystal oscillator 30 shown in FIG. 3. As shown in FIG. 5, in addition to the reset switch 180SW and the pulse generator 180G, the phase noise reduction circuit 180 may further comprise an AC-coupled buffer 180B coupled to the output terminal of the crystal oscillator core circuit 120, and is configured to generate a modified square wave according to the sinusoidal wave. In this embodiment, the pulse generator 180G is configured to generate the reset signal according to the modified square wave, where the position of the reset pulse on the reset signal is set by a control voltage VB1 on a control terminal of the AC-coupled buffer 180B. In particular, the AC-coupled buffer 180B may comprise a capacitor C3, a resistor RB1 and a buffer circuit 181, where the capacitor C3 is coupled between the output terminal of the crystal oscillator core circuit 120 and an input terminal of the buffer circuit 181, the resistor is coupled between the control terminal of the AC-coupled buffer 180B and the capacitor C3. In this embodiment, the capacitor C3 is configured to receive the sinusoidal wave and generate a modified sinusoidal wave. The resistor RB1 is configured to control a bias voltage of the modified sinusoidal wave to be the control voltage VB1, e.g. to make the modified sinusoidal wave vary up and down based on the level of the control voltage VB1. The buffer circuit 181 is configured to generate the modified square wave according to the modified sinusoidal wave. In this embodiment, the pulse generator 180G may comprise a delay cell 182 (which may be an example of the aforementioned very short delay line) and an XOR logic circuit 183. The delay cell 182 is configured to delay the modified square wave (e.g. delay by 80 ps) for generating a modified delayed square wave, and the XOR logic circuit 183 is configured to perform an XOR operation on the modified square wave and the modified delayed square wave to generate the reset signal. For example, when the bias voltage of the modified sinusoidal wave is modified in response to the control voltage VB1, a duty cycle of the modified square wave may be accordingly modified, thereby changing the position of the reset pulse.

Figure 6:
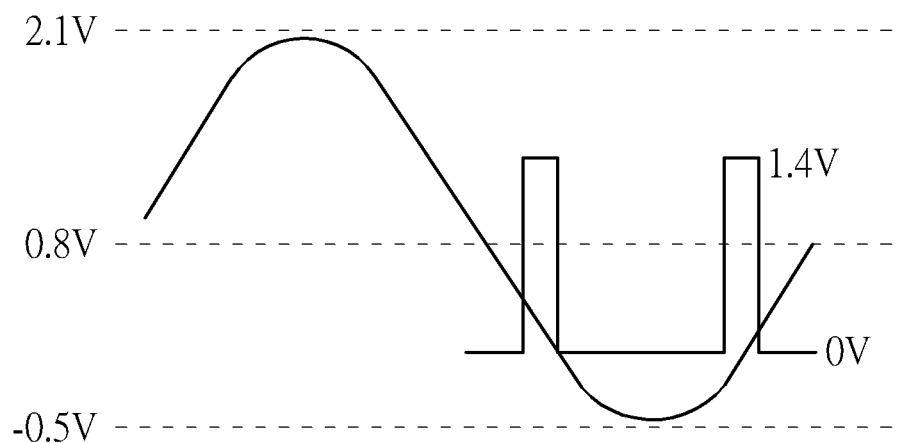
FIG. 6 is diagram illustrating reset pulses generated by a pulse generator shown in FIG. 5 according to an embodiment of the present invention.
Figure 7:
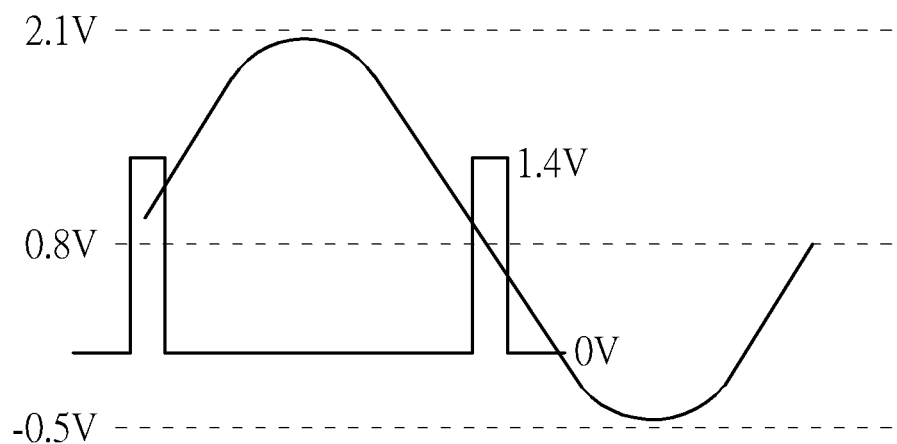
FIG. 7 is diagram illustrating reset pulses generated by a pulse generator shown in FIG. 5 according to another embodiment of the present invention.

Assume that the DC bias voltage VB (e.g. the DC bias voltage of the sinusoidal wave on the output terminal of the crystal oscillator core circuit 120) is set to be 0.8V, and the sinusoidal wave varies between 2.1V and −0.5V. When the control voltage VB1 is set to be a voltage level (e.g. 0V) lower than the DC bias voltage VB, the modified sinusoidal wave may vary up and down based on the level of 0V, and the position of the reset pulse may be within a period at which the sinusoidal wave is below the level of the DC bias voltage VB, as shown in FIG. 6. When the control voltage VB1 is set to be equal to the DC bias voltage VB, such as 0.8V, the modified sinusoidal wave may vary up and down based on the level of 0.8V, and the position of the reset pulse may be quite close to (e.g. slightly later than) the zero-crossing points of the sinusoidal wave, as shown in FIG. 7. Deduced by analogy, when the control voltage VB1 is set to be a voltage level (e.g. 1.4V) greater than the DC bias voltage VB, the modified sinusoidal wave may vary up and down based on the level of 1.4V, and the position of the reset pulse may be within a period at which the sinusoidal wave is above the level of the DC bias voltage VB.

It should be noted that the level of resetting the bias voltage of the sinusoidal wave is not limited to the DC bias voltage VB provided by the DC bias circuit 140. Any constant voltage level can be utilized for resetting the bias voltage of the sinusoidal wave. In some embodiments, the buffer circuit 181 may be implemented by one inverter. In some embodiments, the buffer circuit 181 may be implemented by a chain of inverters. Furthermore, the size of the AC-coupled buffer may be 1/10 times the square wave buffer 160, but the present invention is not limited thereto.

Figure 8:
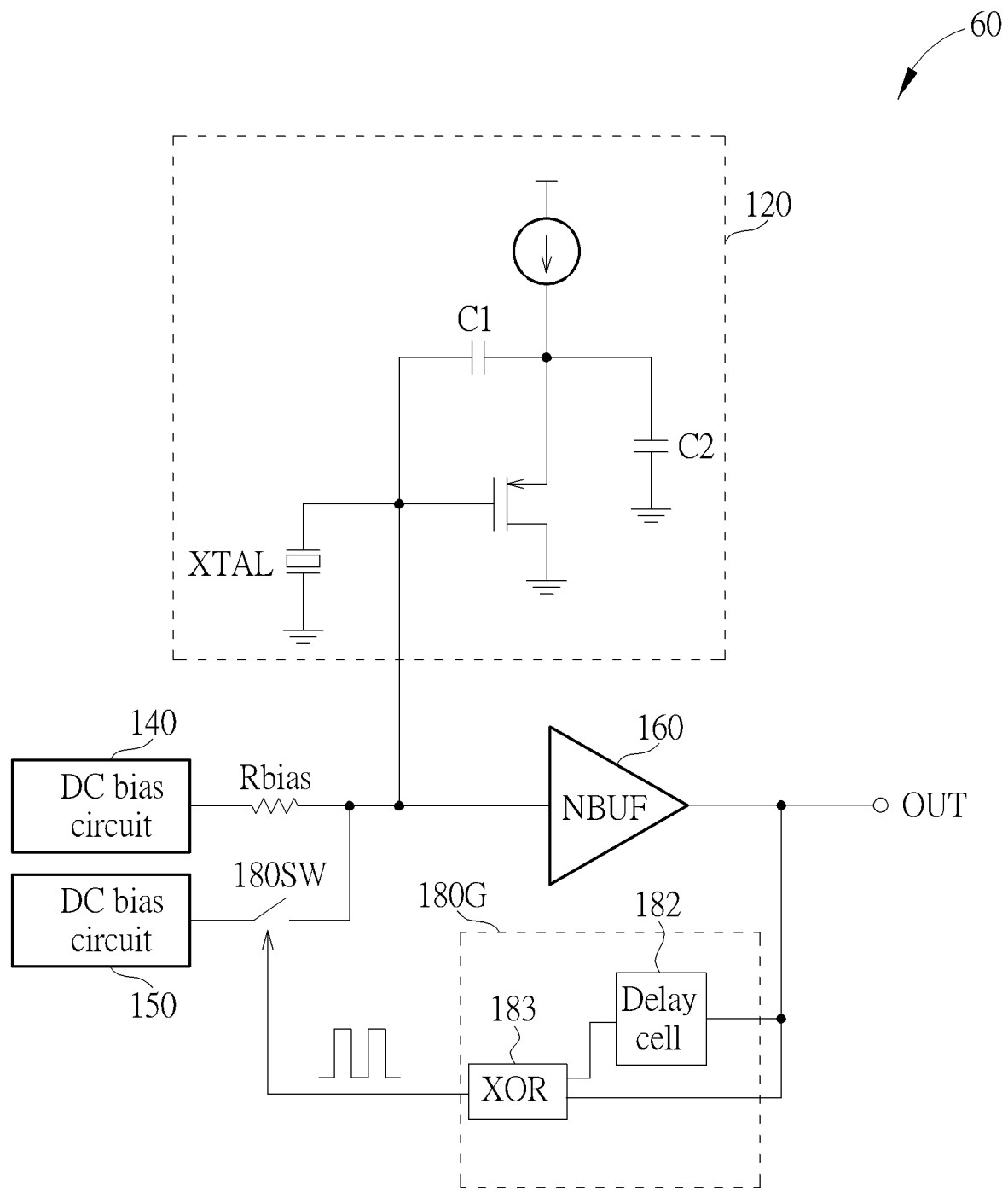
FIG. 8 is a diagram illustrating a crystal oscillator according to an embodiment of the present invention.
Figure 9:
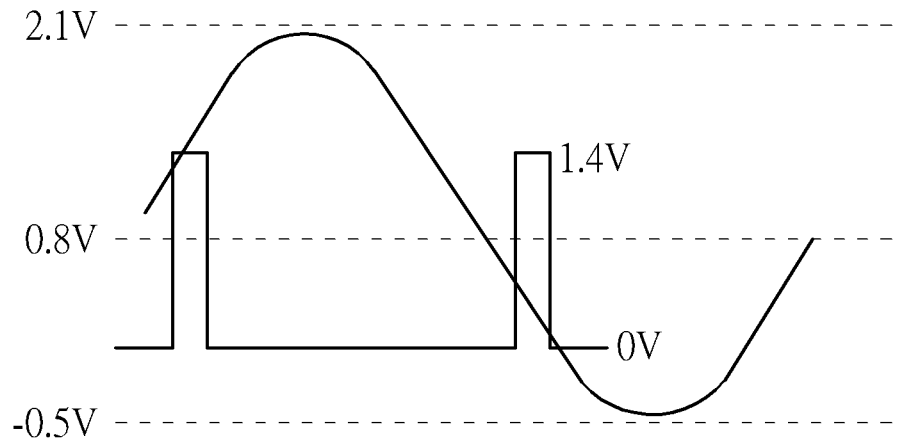
FIG. 9 is diagram illustrating reset pulses generated by a pulse generator shown in FIG. 8 according to an embodiment of the present invention.

FIG. 8 is a diagram illustrating a crystal oscillator 80 according to an embodiment of the present invention, where the crystal oscillator 80 may be a modified version or an example of the crystal oscillator 30 shown in FIG. 3. In this embodiment, the pulse generator 180G is configured to generate the reset signal according to the square wave on the output terminal OUT. More particularly, the delay cell 182 is configured to delay the square wave for generating a delayed square wave, and the XOR logic circuit 183 is configured to perform an XOR operation on the square wave and the delayed square wave to generate the reset signal. As shown in FIG. 8, the voltage level of resetting the bias voltage of the sinusoidal wave may be provided by a DC bias circuit 150, but the present invention is not limited thereto. In some embodiments, the DC bias circuits 140 and 150 may provide the same voltage level. In some embodiments, the DC bias circuits 140 and 150 may provide different voltage levels. Based on this architecture, the reset pulse generated by the pulse generator 180G may be close to the zero-crossing point of the sinusoidal wave, and more particularly, may be slightly later than the zero-crossing point of the sinusoidal wave, as shown in FIG. 9.

Figure 10:
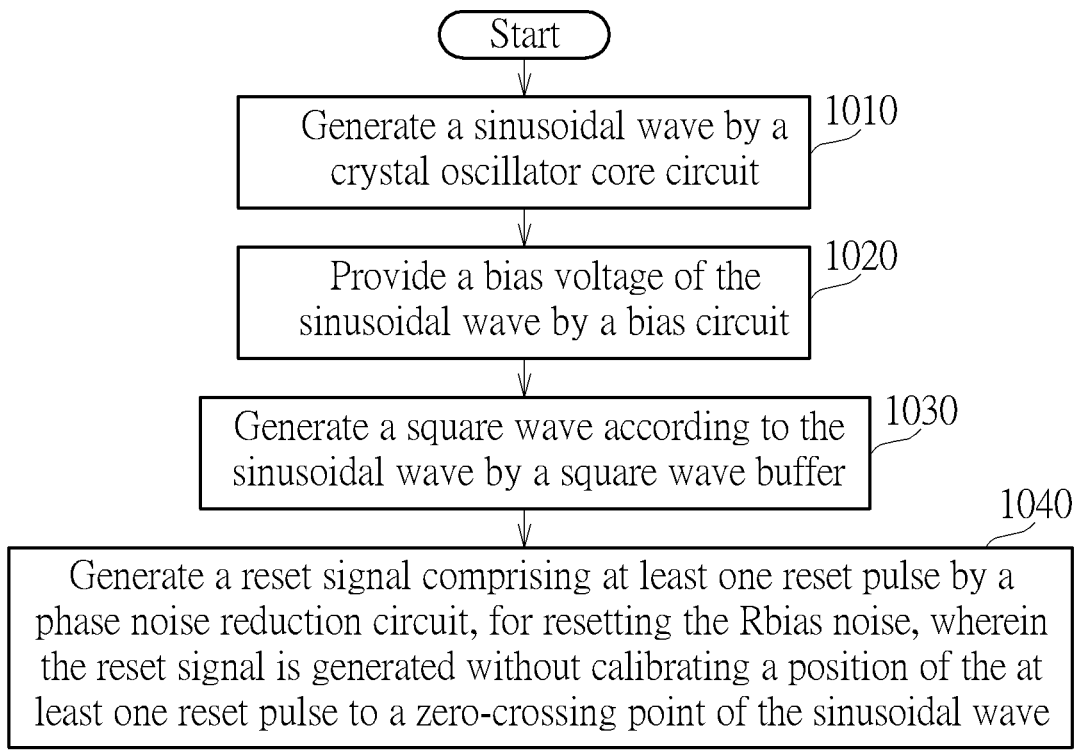
FIG. 10 is a working flow illustrating a phase noise reduction method of a crystal oscillator according to an embodiment of the present invention.

FIG. 10 is a working flow illustrating a phase noise reduction method of a crystal oscillator according to an embodiment of the present invention, wherein the crystal oscillator may be any of the crystal oscillators 30, 50 and 80 respectively shown in FIG. 3, FIG. 5 and FIG. 8. It should be noted that the working flow shown in FIG. 10 is for illustrative purposes only, and is not meant to be a limitation of the present invention. In some embodiments, one or more steps may be added, deleted or modified in the working flow shown in FIG. 10. In addition, if a same result may be obtained, these steps do not have to be executed in the exact order shown in FIG. 10.

In Step 1010, the crystal oscillator may generate a sinusoidal wave by a crystal oscillator core circuit (e.g. the crystal oscillator core circuit 120) of the crystal oscillator.

In Step 1020, the crystal oscillator may provide a bias voltage of the sinusoidal wave by a bias circuit.

In Step 1030, the crystal oscillator may generate a square wave according to the sinusoidal wave by a square wave buffer.

In Step 1040, the crystal oscillator may generate a reset signal comprising at least one reset pulse by a phase noise reduction circuit, for resetting the bias voltage (e.g. resetting the resistor noise such as the Rbias noise on the bias voltage), wherein the reset signal is generated without calibrating a position of the at least one reset pulse to a zero-crossing point of the sinusoidal wave.

To summarize, the present invention provides multiple embodiments of the crystal oscillator and the phase noise reduction method thereof, which utilize very short reset pulse(s) to reset the noise caused by the bias resistor, and more particularly, to reset the bias voltage level which is disturbed by the noise caused by the bias resistor, thereby reduce the phase noise of the square wave output from the square wave buffer. In addition, as the reason why the phase noise is introduced into the square wave is not significantly correlated with the phase of the sinusoidal wave (e.g. the noise occurring at the zero-crossing point of the sinusoidal wave substantially impacts the phase noise of the square wave by the same way as the noise occurring at other positions/phases of the sinusoidal wave), the timing or the position of the reset pulse is not critical, and calibration regarding the timing or the position of the reset pulse can be omitted. Thus, complex calibration and long delay line(s) are not required, so the design complexity and overall power consumption can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A crystal oscillator, comprising:
   a crystal oscillator core circuit, configured to generate a sinusoidal wave;
   a bias circuit, coupled to an output terminal of the crystal oscillator core circuit, configured to provide a bias voltage of the sinusoidal wave;
   a pulse wave buffer, coupled to the output terminal of the crystal oscillator core circuit, configured to generate a pulse wave according to the sinusoidal wave; and
   a phase noise reduction circuit, coupled to the output terminal of the crystal oscillator core circuit, configured to provide an alternating current (AC) ground path for noise on the bias voltage, wherein the phase noise reduction circuit is configured to generate a modified pulse wave according to the sinusoidal wave, and generate a reset signal comprising at least one reset pulse according to the modified pulse wave;
   wherein a position of the at least one reset pulse on the reset signal is set by a control voltage on a control terminal of the phase noise reduction circuit.

2. The crystal oscillator of claim 1, wherein the phase noise reduction circuit comprises:
   a reset switch, coupled to the output terminal of the crystal oscillator core circuit, controlled by a reset signal, wherein the reset switch is turned on in response to the reset signal, to provide the AC ground path for noise on the bias voltage to remove the noise on the bias voltage, and thereby reset the bias voltage of the sinusoidal wave to a reset level.

3. The crystal oscillator of claim 1, wherein a frequency of the reset signal is N times a frequency of the pulse wave, and N is a positive value greater than or equal to two.

4. The crystal oscillator of claim 1, wherein when a pulse width of the at least one reset pulse is reduced, a signal-to-noise ratio (SNR) of the sinusoidal wave is increased.

5. The crystal oscillator of claim 1, wherein the phase noise reduction circuit comprises:
   a capacitor, coupled to the output terminal of the crystal oscillator core circuit, configured to receive the sinusoidal wave and generate a modified sinusoidal wave;

a resistor, coupled between the control terminal of the phase noise reduction circuit and the capacitor, configured to control a bias voltage of the modified sinusoidal wave to be the control voltage; and a buffer circuit, configured to generate the modified pulse wave according to the modified sinusoidal wave.

6. The crystal oscillator of claim 1, wherein the phase noise reduction circuit comprises:

a delay cell, configured to delay the modified pulse wave for generating a modified delayed pulse wave; and an exclusive-OR (XOR) logic circuit, configured to perform an XOR operation on the modified pulse wave and the modified delayed pulse wave to generate the reset signal.

7. A phase noise reduction method of a crystal oscillator, comprising:

generating a sinusoidal wave by a crystal oscillator core circuit of the crystal oscillator;

providing a bias voltage of the sinusoidal wave by a bias circuit;

generating a pulse wave according to the sinusoidal wave by a pulse wave buffer; and providing an alternating current (AC) ground path for the sinusoidal wave by a phase noise reduction circuit, wherein providing the AC ground path comprises:

generating a modified pulse wave according to the sinusoidal wave; and generating a reset signal according to the modified pulse wave;

wherein a position of at least one reset pulse on the reset signal is set by a control voltage on a control terminal of the phase noise reduction circuit.

8. The phase noise reduction method of claim 7, wherein providing the AC ground path comprises:

turning on a reset switch in response to at least one reset pulse, to provide the AC ground path for noise on the bias voltage to remove the noise on the bias voltage, and thereby reset the bias voltage of the sinusoidal wave to a reset level.

9. The phase noise reduction method of claim 7, wherein a frequency of the reset signal is N times a frequency of the pulse wave, and N is a positive value greater than or equal to two.

10. The phase noise reduction method of claim 7, wherein when a pulse width of the at least one reset pulse is reduced, a signal-to-noise ratio (SNR) of the sinusoidal wave is increased.

11. The phase noise reduction method of claim 7, wherein generating the modified pulse wave comprises:

receiving the sinusoidal wave and generating the modified sinusoidal wave by a capacitor;

controlling a bias voltage of the modified sinusoidal wave to be the control voltage by a resistor; and generating the modified pulse wave according to the modified sinusoidal wave by a buffer circuit.

12. The phase noise reduction method of claim 7, wherein generating the reset signal according to the modified pulse wave comprises:

delaying the modified pulse wave for generating a modified delayed pulse wave; and performing an exclusive-OR (XOR) operation on the modified pulse wave and the modified delayed pulse wave to generate the reset signal.

* * * * *